United States Patent [19]

Molin

[11] Patent Number: 5,521,539
[45] Date of Patent: May 28, 1996

[54] DELAY LINE PROVIDING AN ADJUSTABLE DELAY

[75] Inventor: Stuart B. Molin, Oceanside, Calif.

[73] Assignee: Brooktree Corporation, San Diego, Calif.

[21] Appl. No.: 986,723

[22] Filed: Dec. 8, 1992

Related U.S. Application Data

[63] Continuation of Ser. No. 744,452, Aug. 12, 1991, abandoned, which is a continuation of Ser. No. 509,903, Apr. 16, 1990, abandoned.

[51] Int. Cl.$^6$ .................................................. H03H 11/26
[52] U.S. Cl. .......................... 327/274; 327/270; 327/287
[58] Field of Search .................................. 307/603, 605, 307/608, 268; 328/55; 327/270, 274, 272, 285, 287, 288, 65

[56] References Cited

U.S. PATENT DOCUMENTS

| | | |
|---|---|---|
| 4,866,314 | 9/1989 | Traa ......................................... 307/603 |
| 4,893,036 | 1/1990 | Hester et al. ........................... 307/603 |

*Primary Examiner*—Timothy P. Callahan
*Assistant Examiner*—Toan Tran
*Attorney, Agent, or Firm*—Ellsworth R. Roston; Charles H. Schwartz

[57] ABSTRACT

First and second complementary input voltages control current flow through first and second switches (e.g. semiconductor devices) each respectively connected in first and second control circuits with a first constant current source. When the input voltages change, current starts to increase through one control circuit to produce increases in the voltage drop across an impedance (e.g. resistor) in such circuit. When a particular voltage difference is produced between the impedance voltage and an adjustable biasing voltage, a third switch (e.g. semiconductor device) closes to produce a first resultant voltage. The resultant delay in the third switch closure is dependent upon the adjustable magnitude of the biasing voltage. As the voltage increases across the impedance in the one control circuit, the voltage decreases across an impedance in the other control circuit, causing a second resultant voltage to be produced at a fourth switch (e.g. semiconductor device). The resultant voltages are respectively introduced to fifth and sixth switches (e.g. semiconductor devices) each connected in a circuit with an individual one of second and third constant current sources. When the resultant voltages change, the particular one of the fifth and sixth switches receiving an increase in current passes a portion of this current through the associated current source and another portion of this current through a coupling member and the other current source. This delays the state of non-conductivity of the switch connected to the other current source. Output voltages further delayed from the input voltages are accordingly obtained from the fifth and sixth switches.

31 Claims, 5 Drawing Sheets

DELAY LINE PROVIDING AN ADJUSTABLE DELAY

This is a continuation of application Ser. No. 07/744,452 (now abandoned) filed Aug. 12, 1991, which application is in turn a continuation of application Ser. No. 07/509,903 filed Apr. 16, 1990 (now abandoned).

This invention provides a stage with a delay precisely adjustable through a wide time range. More particularly, this invention relates to a stage which is able to provide such a delay with low power consumption and through a wide range of frequencies without any effect on the delay by changes in frequencies.

Two types of delay lines generally exist in the prior art. One type consists of a family of passive delay lines which use distributed inductance (L)—capacitive (C) components. The sum of the distributed L-C delays add to the desired total delay. Taps connected to the L-C components provide particular fractions of the total delay dependent upon the positions of the taps. The delay resolution is accordingly limited by the number of taps which are in turn limited by the physical dimensions of the taps. This family of passive delay lines also has other undesirable characteristics including output waveform distortion and delay sensitivity to input frequency as a result of changes in the values of the inductances (L) and capacitances (C) with changes in frequency.

A second type of delay line constitutes a monolithic delay line designed with a string of stages connected in series. Output signal delay can be achieved by multiplexing taps along the string of stages. Because of this, the resolution of the delay in the monolithic line is limited by the number of taps. Furthermore, since the delay per stage is quite small (less than 100 picoseconds), the total range of delay is limited to the delay per stage multiplied by the number of stages in the monolithic line.

Delay lines have existed for a long period of time, probably in the order of at least several decades. In all of that period of time, the limitations of existing gates have been known. These include the limited range of delay provided by a delay line (or delay lines in series), the inability to provide precise and predictable delays and the effect on the delay of changes in the frequency of signals introduced to the line. In all of this period of time, no one has been able to provide a delay line which overcomes the above limitations.

This invention provides a delay line which overcomes, or at least minimizes, the disadvantages discussed above. For example, the invention provides a plurality of stages in series and provides for each stage a delay of as much as six tenths of a nanosecond (0.6 ns) per stage. Furthermore, the delay for each stage can be adjustable to any value within this maximum range. The invention also provides a minimal sensitivity in the changes in delay in each stage as a result of changes in frequency. The invention is able to provide these precise delays in a frequency range greater than two hundred megahertz (200 MHz). The delay line of this invention has a small size and consumes a low amount of power.

In one embodiment of the invention, first and second complementary input voltages control the flow of current through first and second switches (e.g. semiconductor devices) each respectively connected in first and second control circuits with a first constant current source. When the input voltages change, current starts to increase through one of the control circuits to produce increases in the voltage drop across an impedance (e.g. resistor) connected in such circuit.

When a particular voltage difference is produced between the impedance voltage and an adjustable biasing voltage, a third switch (e.g. semiconductor device) closes to produce a first resultant voltage. The resultant delay in the closure of the third switch is dependent upon the magnitude of the adjustable biasing voltage. As the voltage increases across the impedance in the one control circuit, the voltage decreases across an impedance connected in the other control circuit. This decreasing voltage causes a second resultant voltage to be produced at a fourth switch (e.g. semiconductor device).

The resultant voltages are respectively introduced to fifth and sixth switches (e.g. semiconductor devices) each connected in a circuit with an individual one of second and third constant current sources. When the resultant voltages change, the particular one of the fifth and sixth switches receiving an increase in current passes a portion of this current through the associated current source and another portion of this current through a coupling member and the other current source. This delays the state of non-conductivity of the switch connected to the other current source. Output voltages further delayed from the input voltages are accordingly obtained from the fifth and sixth switches.

A plurality of delay stages may be provided, each including the first through sixth switches (e.g. semiconductor devices). To shorten the response time of each stage while maintaining the delay provided in such stages, the outputs from the third and fourth semiconductor devices in each delay stage may be respectively introduced through coupling capacitors to the fifth and sixth semiconductor devices in the previous delay stage. This shortens the time between the successive productions of the additional delay by the fifth and sixth semiconductor devices in each stage in response to the first and second complementary resultant voltages in that stage without affecting the production of such additional delay.

Figure 1:
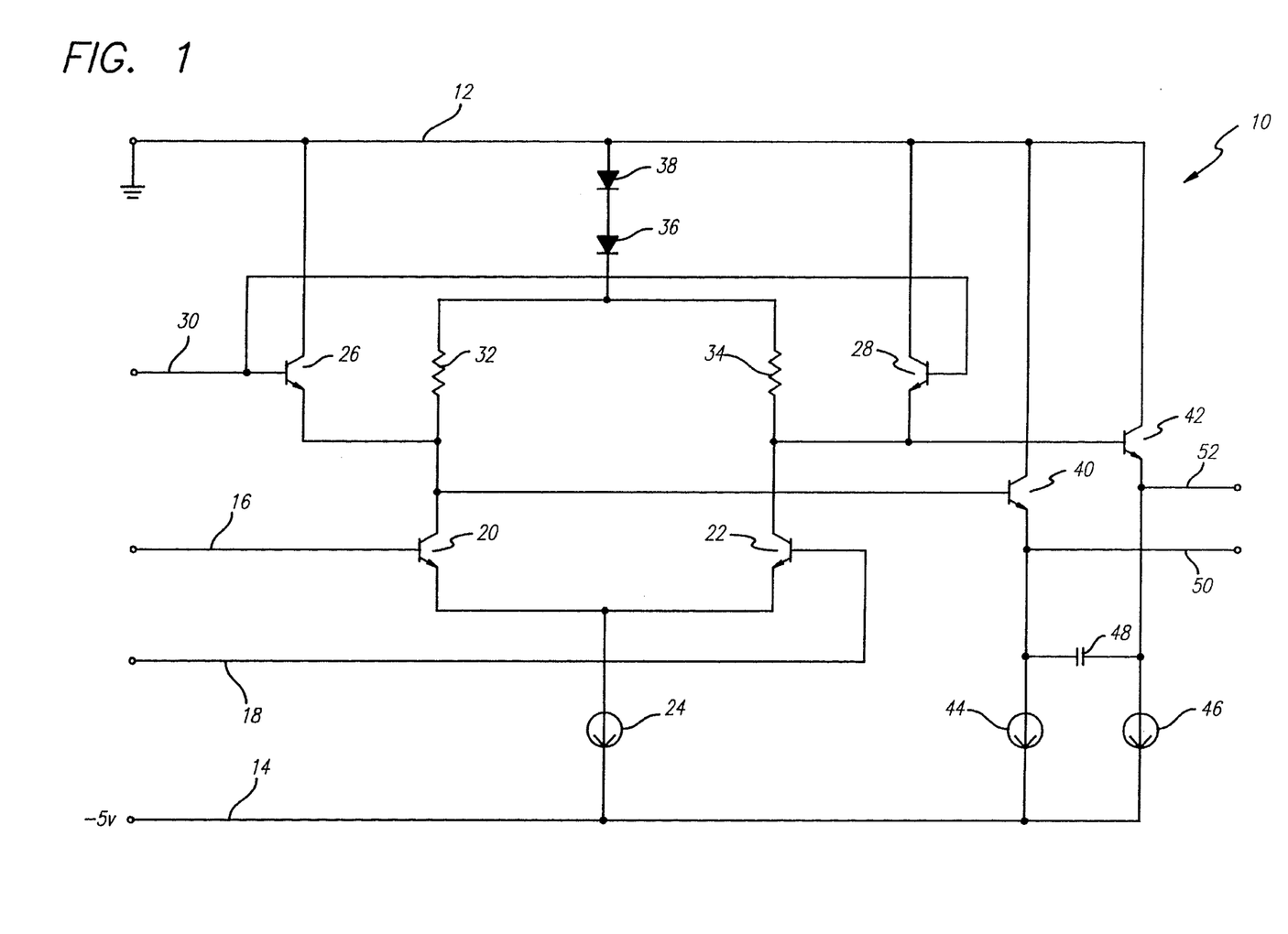
FIG. 1 is a somewhat simplified circuit diagram of a gate constituting one embodiment of the invention, the gate being included in a delay line also constituting an embodiment of the invention.

FIG. 1 is a somewhat simplified circuit diagram of a gate generally indicated at 10 and constituting on embodiment of the invention. The gate includes a plurality of switches each of which may constitute a semiconductor device. The gate is preferably formed by bi-polar techniques but may also be formed by other techniques such as C-MOS techniques. When the gate is formed as by bi-polar techniques, a line 12 providing a reference potential such as ground and a line 14 providing an energizing voltage such as −5 volts are provided.

A pair of lines 16 and 18 are also included to provide complementary input voltages which may be respectively designated as IN and INN. The voltages on the lines 16 and 18 are respectively introduced to first terminals of a pair of switches such as the bases of semiconductor devices 20 and 22, both of which may be npn transistors. The emitters of the semiconductor devices 20 and 22 are common with one terminal of a constant current source 24, the other terminal of the constant current source receiving the energizing voltage on the line 14. The constant current source 24 may be constructed in a conventional manner well known in the prior art.

The collectors of the semiconductor devices 20 and 22 are respectively connected to the first terminals of switches such as the emitters of semiconductor devices 26 and 28, both of which may be npn transistors. The bases of the semiconductor devices 26 and 28 receive an adjustable biasing voltage on a line 30. The biasing voltage may be adjustable in a conventional manner well known in the prior art. The collectors of the semiconductor devices 26 and 28 are common with the reference potential such as ground on the line 12.

The collectors of the semiconductor devices 20 and 22 are also respectively connected to first terminals of impedances such as resistors 32 and 34. The second terminals of the resistors 32 and 34 are common with the cathode of a diode 36, the anode of which is connected to the cathode of a diode 38. The anode of the diode 38 is in turn common with the line 12 providing the ground potential. Each of the diodes 36 and 38 may be constructed to provide a particular potential across the diode. For example, this potential may be approximately seven-tenths of a volt (0.7 V).

Connections are also respectively made from the collectors of the semiconductor devices 20 and 22 to first terminals of switches such as the bases of semiconductor devices 40 and 42. Constant current sources 44 and 46 constructed in a manner similar to the constant current source 24 are respectively connected between the emitters of the semiconductor devices 40 and 42 and the line 14 providing the energizing potential of approximately −5 volts. A capacitor 48 is respectively connected between the emitters of the semiconductor devices 40 and 42. Output lines 50 and 52 respectively extend from the emitters of the semiconductor devices 40 and 42. The collectors of the semiconductor devices 40 and 42 are common with the line 12 providing the reference potential such as ground.

Assume that current flows through the semi-conductor device 22 because of the production of a high voltage on the line 18 to represent a binary "0" and that current does not flow through the semiconductor device 20 because of the production of a low voltage on the line 16. A portion of the current through the semiconductor device 22 flows through a circuit including the line 12, the diodes 38 and 36, the resistor 34, the semiconductor device 22 and the constant current source 24. The remaining portion of this current flows through the semiconductor device 28. The current through the semiconductor device 22 is substantially constant because of the action of the constant current source.

When a high voltage is produced on the line 16 to represent a binary "1", current starts to flow through the semiconductor 20. At the same time, the current through the semiconductor device 22 starts to decrease because a low voltage is simultaneously produced on the line 18. A line 74 in FIG. 3 indicates the time that the voltage on the base of the semiconductor 20 device starts to equals the voltage on the base of the semiconductor device 22.

Since the current through the source 24 is constant and since the diodes 38 and 36 are connected to both the semiconductor device 20 and the semiconductor device 22, the current through the diodes 38 and 36 remains constant even as the current through the semiconductor device 20 is increasing and the current through the semiconductor device 22 is decreasing. This constant current causes constant voltages to be produced across the diodes 38 and 36. The voltage across each of the diodes 38 and 36 may be in the order of seven tenths of a volt (0.7 V).

As the current through the semiconductor device 20 increases, an increasing voltage is produced across the resistor 32. The resultant voltage across the diodes 38 and 36 and the resistor 32 is introduced to the emitter of the semiconductor device 26. The semiconductor device 26 is constructed to become conductive when the voltage on the base of the semiconductor device is greater by a particular value than the voltage on the emitter of the semiconductor device. This particular value may be approximately seven tenths of a volt (0.7 V).

Figure 3:
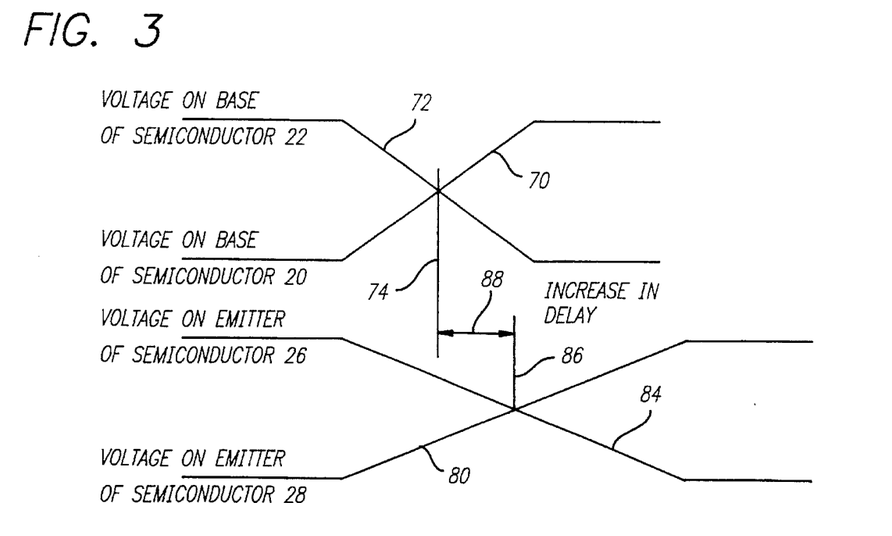
FIG. 3 illustrates voltage waveforms produced by the gate shown in FIG. 1 and illustrates the time delay provided by a first stage in the gate of FIG. 1.

Until this voltage is produced on the emitter of the transistor 26, the voltage on the emitter of the transistor becomes progressively negative as indicated at 84 in FIG. 3. When the transistor 26 becomes conductive, the voltage on the emitter of the transistor 26 no longer decreases.

As will be seen, the time for producing the conductivity of the semiconductor device 26 is dependent upon the biasing voltage applied to the line 30. For example, when a biasing voltage of approximately −0.8 volts is provided on the line 30, the semiconductor device 26 becomes conductive when the voltage on the emitter of the semiconductor device 26 reaches −1.5 volts. Similarly, when a biasing voltage of approximately −1.6 volts is provided on the line 30, the semiconductor device 26 becomes conductive when the voltage on the emitter of the semiconductor 26 reaches −2.3 volts. The biasing voltage on the line 30 accordingly controls the voltage swings on the collectors of the semiconductor devices 20 and 22.

As will be appreciated, since a greater current is required through the resistor 32 for the voltage on the collector of the semiconductor device 20 to reach −2.3 volts than to reach −1.5 volts, the delay in the conductivity of the semiconductor device 26 is dependent upon the magnitude of the biasing voltage provided on the line 30. This delay increases as the magnitude of the biasing voltage on the line 30 increases.

As will be seen in FIG. 3, a vertical line 74 is schematically indicated to indicate the time that the voltage on the base of the semiconductor device 20 exceeds the voltage on the base of the semiconductor device 22 when a high voltage is introduced to the line 16 and a low voltage is introduced to the line 18. When the semiconductor device 26 thereafter starts to become conductive, the resultant voltage on the emitter of the semiconductor device 26 no longer decreases. This is indicated at 84a in FIG. 3.

At the same time that the resultant voltage on the emitter of the transistor 26 is starting to fall before the transistor becomes conductive, the resultant voltage on the emitter of the semiconductor device 28 starts to rise. This is indicated at 80 in FIG. 3. The time required for the voltage on the emitter of the semiconductor device 28 to be more positive than the voltage on the emitter of the semiconductor device 26 is indicated at 86 in FIG. 3.

The delay in the time required to produce a more positive voltage on the emitter of the semiconductor device 28 (or the collector of the semiconductor device 22) than on the emitter of the semiconductor device 26 (or the collector of the semiconductor device 20) as a result of the delay provided by the semiconductor device 26 is indicated at 88 in FIG. 3. As will be seen from the previous discussion, the delay 88 can be adjusted by adjusting the biasing voltage on the line 30.

The resultant voltages on the collectors of the semiconductor devices 20 and 22 are respectively introduced to the bases of the semiconductor devices 40 and 42. Assume that the voltage on the base of the semiconductor device 42 is low and that the voltage on the base of the semiconductor device 40 is high. The current in the semiconductor device 40 corresponds to the current in the current source 44 and the current in the semiconductor device 42 corresponds to the current in the current source 46.

Figure 4:
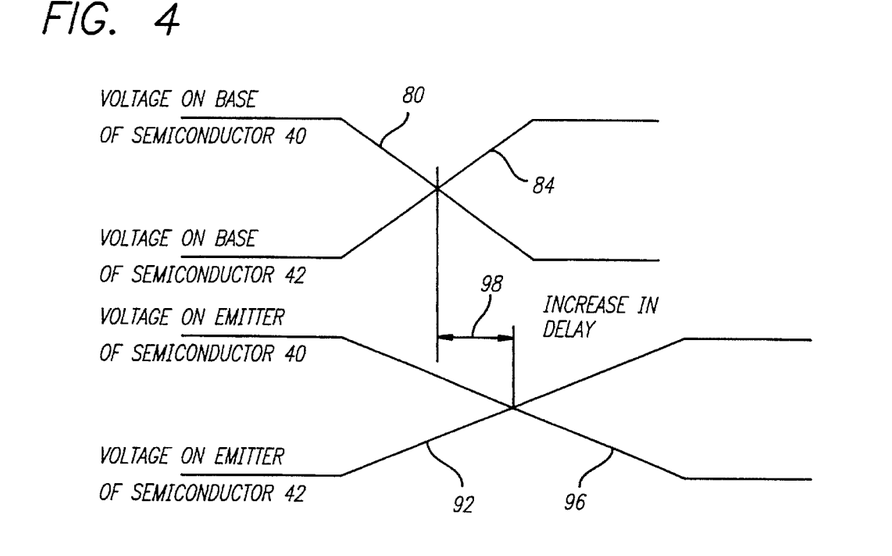
FIG. 4 illustrates voltage waveforms produced by a second stage in the gate shown in FIG. 1 and illustrates the time delay provided by such stages.

Assume now that the voltage on the base of the semiconductor device 42 becomes more positive on a transient basis as indicated at 80 in FIG. 3 and that the voltage on the base of the semiconductor device 40 simultaneously becomes more negative on a transient basis as indicated at 84 in FIG. 3. The voltage on the emitter of the semiconductor device 42 follows the voltage on the base of the semiconductor device such that a transient voltage is generated on the emitter of the semiconductor device as indicated at 92 in FIG. 4. This causes a transient current to flow through the capacitor 48. As a result, a current is generated in the semiconductor device 42 during this transient period as a result of the operation of the current source 46 and the flow of a transient current through the capacitor 48.

Since the other side of the capacitor 48 is connected to the current source 44, the current through the capacitor 48 (whose direction is the same as the current through the current source 44) will not exceed the current in the source 44. This causes the current through the semiconductor device 40 to be equal to the current through the current source 44 minus the current through the capacitor 48. This causes the semiconductor device 40 to be deprived of its normal current during the transient period.

Thus, even though the base of the semiconductor device 40 has assumed a steady state after the transient decrease in voltage on the base, the voltage on the emitter of the semiconductor device lags the voltage on the base of the semiconductor device until the emitter has received an appropriate share of the current. The transient voltage on the emitter of the semiconductor device 40 is indicated at 96 in FIG. 4. The delay in the response of the semiconductor device 40 relative to the response of the semiconductor device 42 may be seen from a comparison in the times for the beginning of the voltage transients 92 and 96. The resultant delay is indicated at 98 in FIG. 4.

The circuit shown in FIG. 1 accordingly provides two (2) time delays. One of these time delays is produced by the stage including the semiconductor devices 20, 22, 26 and 28 and the constant current source 24. The delay provided by this stage can be adjusted by varying the biasing voltage applied to the line 30. As will be appreciated, this delay can be continuously adjustable to any desired value within the range of delays provided by the semiconductor devices 20, 22, 26 and 28. A second delay can be provided in a stage including the semiconductor devices 40 and 42 and the constant current sources 44 and 46. The total amount of delay provided by the circuit shown in FIG. 1 can be as much as six tenths of a nanosecond (0.6 ns).

The circuit shown in FIG. 1 has other important advantages in addition to providing a continuously adjustable delay. As will be seen, the circuit shown in FIG. 1 has no inductances and only a single capacitor constituting the coupling capacitor 48. The delay provided by the circuit shown in FIG. 1 is accordingly affected only minimally, if at all, by changes in frequency. This is true through a frequency range in excess of two hundred megahertz (200 MHz). Furthermore, the circuit (or gate) shown in FIG. 1 has a small size and low power consumption.

Figure 2:
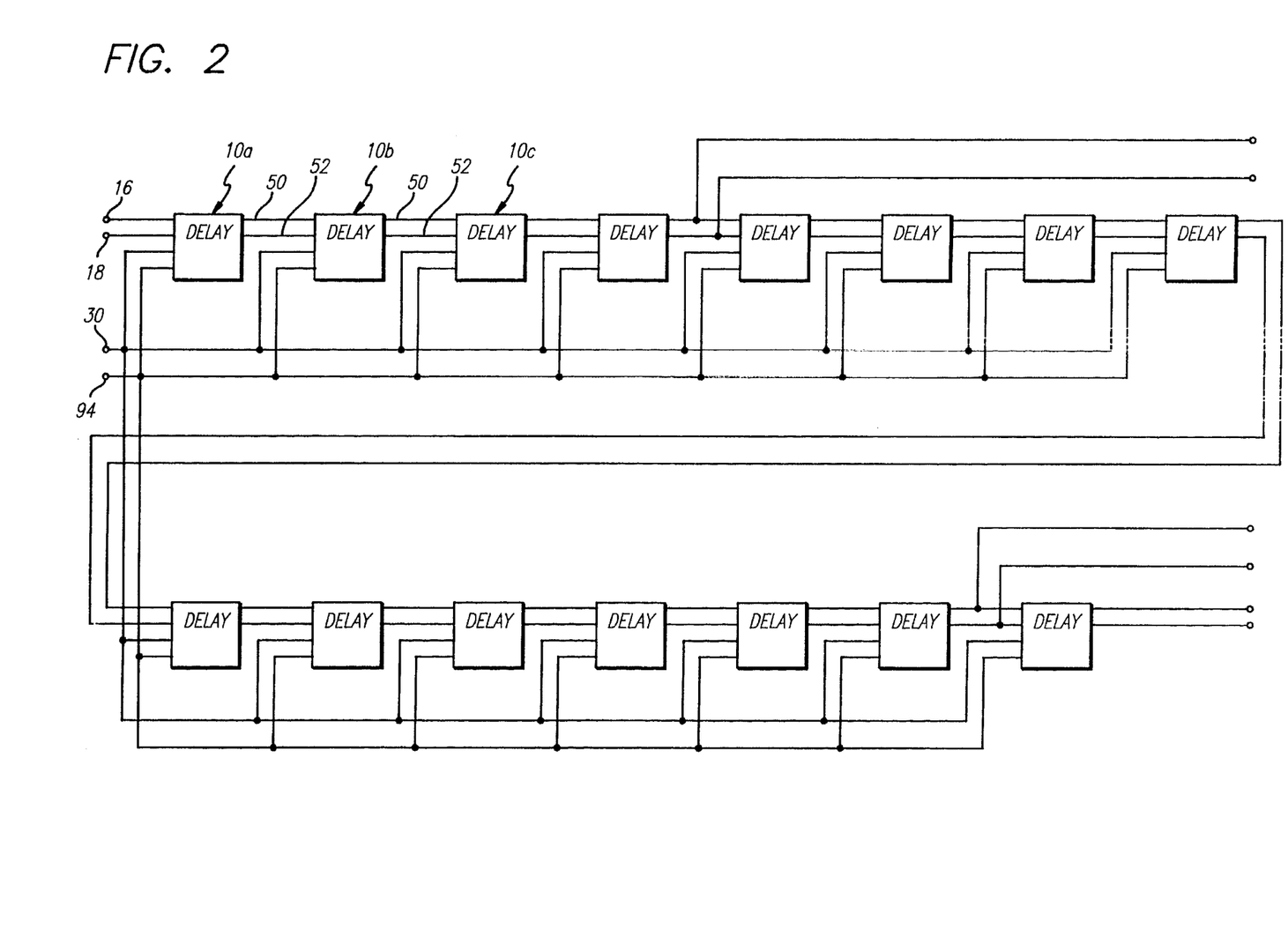
FIG. 2 is a block diagram of the delay line which is formed from a series arrangement of a plurality of the gates shown in FIG. 1.

As will be appreciated, the circuit (or gate) shown in FIG. 1 can be included in a delay line formed from a plurality of stages of identical construction. This is shown in FIG. 2. In that Figure, a plurality of delay stages generally indicated at 10a, 10b, 10c, etc., of identical construction are connected in series. The output lines from each delay stage correspond to the lines 50 and 52 in FIG. 1. The input lines to the next delay stage correspond to the lines 16, 18 and 30 in FIG. 1 and to the line 94 in FIGS. 6 and 7.

Figure 5:
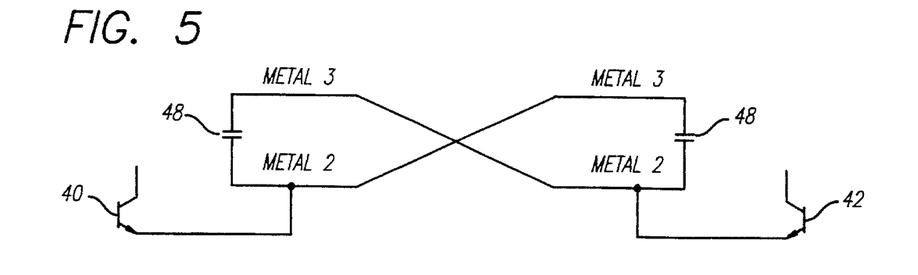
FIG. 5 is a schematic diagram indicating how metal layers in an integrated circuit chip may be applied to the emitters of a pair of semiconductor devices in the gate shown in FIG. 1 to enhance the performance of the gate.

In order to provide the semiconductor devices 40 and 42 in FIG. 1 with substantially equal characteristics, connections are made symmetrically to the emitters of the semiconductor devices. These symmetrical connections are shown schematically in FIG. 5. As illustrated in FIG. 5, a "metal 3" line at a position above the semiconductor device 40 is coupled to a "metal 2" line which is connected to the emitter of the semiconductor device 42. Similarly, a "metal 3" line at a position above the semiconductor device 42 is coupled to a "metal 2" line at a position above the semiconductor device 40, and the "metal 2" line is connected to the emitter of the semiconductor device 40. The "metal 2" and "metal 3" lines are normally found in bi-polar chips to provide voltages at various terminals in the chips. Capacitors 48 (also shown in FIGS. 1, 6 and 7) shown connected between the "metal 2" and "metal 3" lines are schematic representations of distributed capacitances between the lines.

Cross connections are provided between the metal 2 and metal 3 lines so tat the distributed capacitances (other than those defining the capacitance 48) at the emitters of the transistors 40 and 42 will be balanced.

Figure 6:
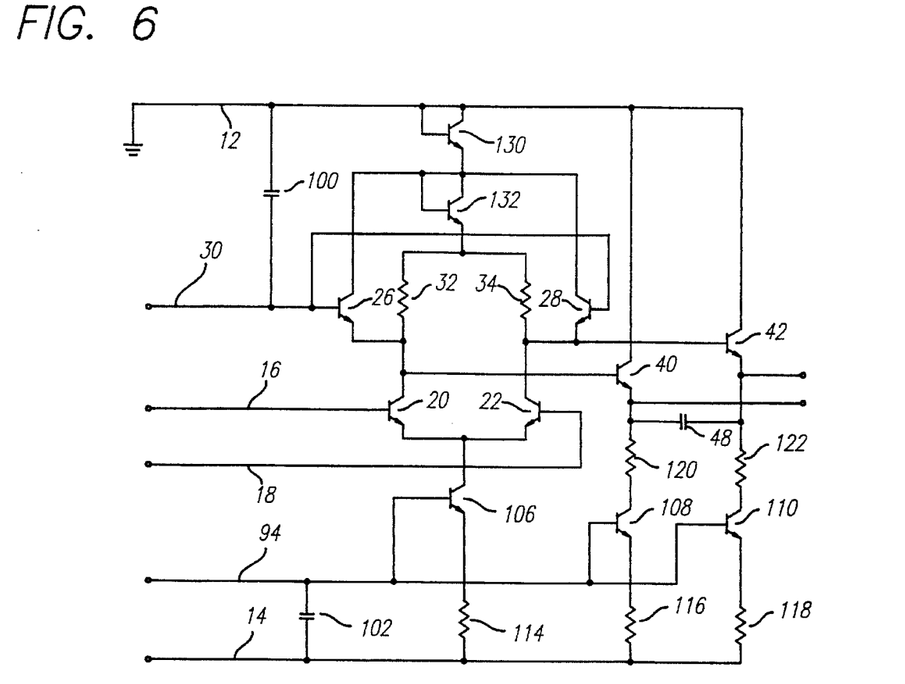
FIG. 6 is a somewhat expanded circuit diagram of the gate shown in FIG. 1.

The circuit shown in FIG. 6 is substantially identical to the circuit shown in FIG. 1 except for certain minor changes and additions. The circuit shown in FIG. 6 includes a capacitor 100 connected between the lines 12 and 30 to filter noise. The circuit shown in FIG. 6 also includes a capacitor 102 connected between the line 14 and a line 94 to filter noise. The line 94 provides a biasing voltage.

In FIG. 6, the constant current sources 24, 44 and 46 are respectively shown as transistors 106, 108 and 110, all of which may be npn transistors. The bases of the transistors 106, 108 and 110 are biased at a constant voltage by the voltage on the line 94. Resistors 114, 116 and 118 are respectively connected between the emitters of the transistors 106, 108 and 110 and the line 14. Resistors 120 and 122 may also be respectively connected between the collectors of the semiconductors 108 and 110 and the emitters of the semiconductors 40 and 42.

As will be seen, the diodes 38 and 36 constitute in FIG. 6 npn devices 130 and 132 in each of which the base and collector have a common connection. Furthermore, the collectors of the semiconductor devices 26 and 28 are shown in FIG. 6 as being connected to the base and collector of the device 132 and the emitter of the device 130. These connections do not affect the operation of the circuit as described above.

Figure 7:
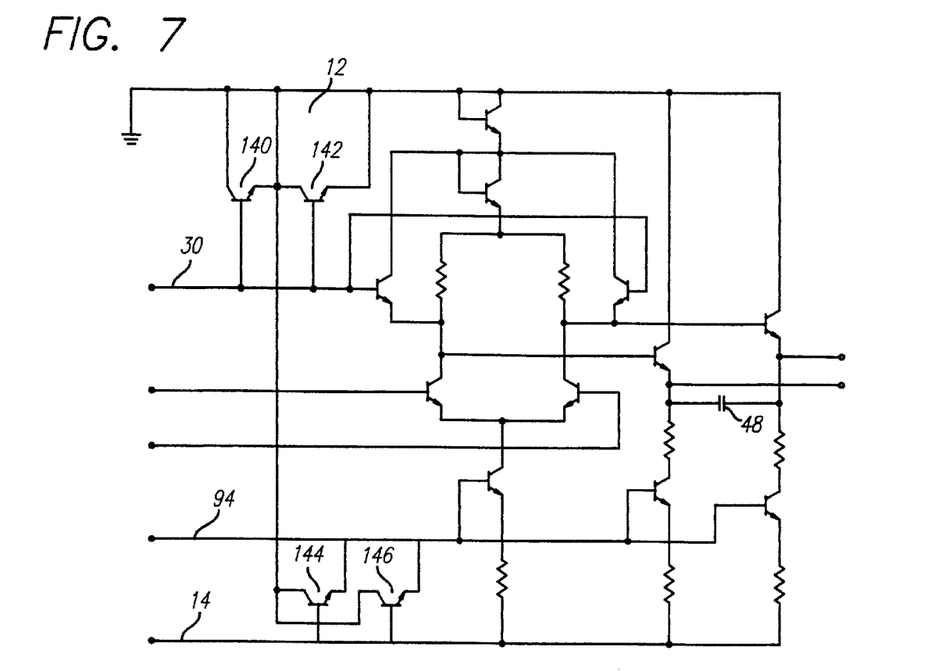
FIG. 7 is an even more expanded circuit diagram of the gate shown in FIG. 1.

The circuit shown in FIG. 7 is identical to the circuit shown in FIG. 6 except for some minor changes. As shown in FIG. 7, the filter capacitor 100 is formed from a pair of semiconductor devices 140 and 142 each of which may be npn semiconductor devices. The base of each of the semiconductor devices 140 and 142 may be connected to the biasing line 30 and the emitter and collector of each semiconductor device may be connected to the reference line 12. Similarly, the filter capacitor 102 may be formed from a pair of semiconductor devices 144 and 146 which may be npn transistors. The base of each of the transistors 144 and 146 may be connected to the line 14 and the emitter of each of these semiconductor devices may be connected to the biasing line 94.

The collectors of the transistors 144 and 146 are connected to the reference line 12.

Figure 8:
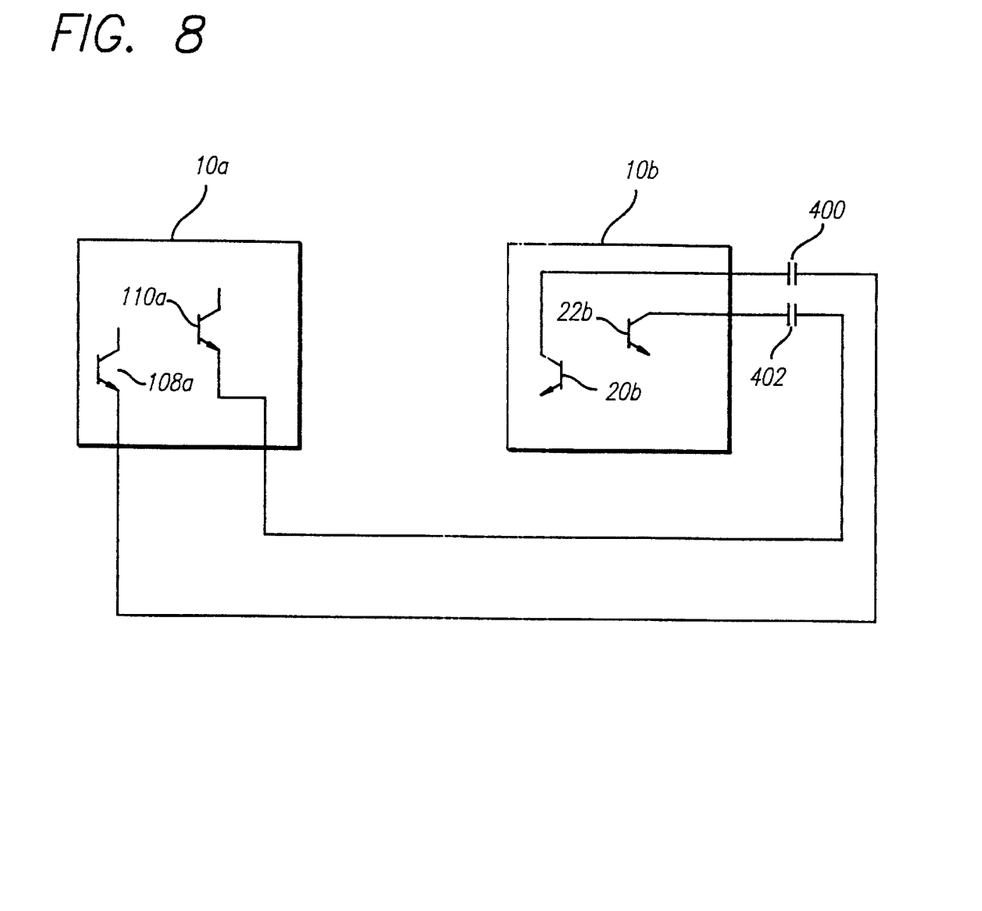
FIG. 8 is a schematic circuit diagram of another embodiment of the invention, this embodiment including two successive delay stages and connections from the second delay stage to the first stage to accelerate the time that the first delay stage is able to respond to successive input voltages.

FIG. 8 illustrates another embodiment of the invention for accelerating the response time of the invention to successive input voltages on the lines 16 and 18. The embodiment shown in FIG. 8 includes the delay stages shown in FIG. 2, only the delay stages 10a and 10b being shown in FIG. 8 for purposes of illustration. In the embodiment shown in FIG. 8, the voltages on the collectors of the semiconductor devices 20b and 22b in the delay stage 10b are respectively coupled through capacitors 400 and 402 to the emitters of the semiconductor devices 108a and 110a (see FIG. 6) in the delay stage 10a. Similar connections may be made from each delay stage in FIG. 2 to the previous stage in FIG. 2.

Figure 9:
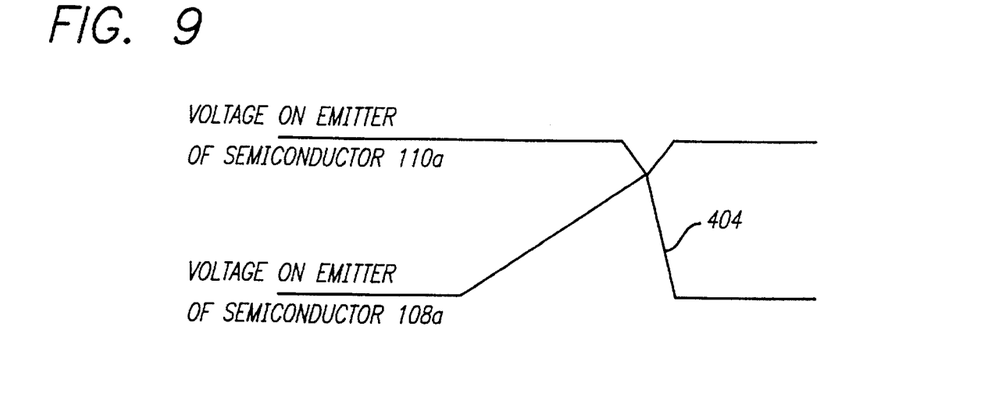
FIG. 9 illustrates voltage waveforms produced by the embodiment shown in FIG. 8 to accelerate the time that the first delay stage is able to respond to successive input voltages.

FIG. 9 illustrates the voltages respectively produced on the emitters of the semiconductor devices 108a and 110a in the delay stage 10a in FIG. 8 when the voltages produced on the collectors of the semiconductor devices 20b and 22b in the delay stage 10b are respectively introduced through the coupling capacitors 400 and 402 to the emitters of the semiconductor devices 108a and 110a (see FIG. 6) in the delay stage 10a.

As will be seen in FIG. 9, the feedback of the voltages on the collectors of the semiconductor devices 20b and 22b in the delay stage 10b to the emitters of the semiconductor devices 108a and 110a in the delay stage 10a accelerates the time that the emitters of the semiconductor devices 108a and 110a reach a steady state voltage. This shortens the time in which the semiconductor devices 108a and 110a in the delay stage 10a become ready to respond to updated input voltages on the lines 16 and 18 in FIG. 1. This may be seen by comparing (in FIG. 4) the slope of the voltage 96 on the emitter of the semiconductor device 108a in FIG. 6 with the slope (in FIG. 9) of the voltage 404 on the emitter of the semiconductor device 110a in FIG. 8.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination in a delay stage for providing an adjustable delay, means for providing an adjustable biasing voltage, means for providing first and second complementary input voltages, means for providing a first constant current, first resultant voltage means responsive to changes in the first complementary input voltage and including the first constant current means and including a first particular terminal for producing changes in a first resultant voltage at the first particular terminal in accordance with such changes in the first complementary input voltage, second resultant voltage means responsive to changes in the second complementary input voltage and including the constant current means and including a second particular terminal for producing changes in a second particular resultant voltage at the second particular terminal in accordance with such changes in the second complementary input voltage, means operatively coupled to the first particular terminal and responsive to the adjustable biasing voltage and the changes in the first resultant voltage at the first particular terminal for maintaining the first resultant voltage at the first particular terminal at a first particular level when a particular relationship exists between the adjustable biasing voltage and the first resultant voltage, and means operatively coupled to the second particular terminal and responsive to the adjustable biasing voltage and the changes in the second resultant voltage at the second particular terminal for maintaining the second resultant voltage at the second particular terminal at a second particular level when the particular relationship exists between the adjustable biasing voltage and the first resultant voltage, means for providing a second constant current, means for providing a third constant current, first output voltage means responsive to the voltage at the first particular terminal and including the second constant current means for producing a first output voltage having characteristics dependent upon the characteristics of the voltage at the first particular terminal, second output voltage means responsive to the voltage at the second particular terminal and including the third constant current means for producing a second output voltage having characteristics dependent upon the characteristics of the voltage at the second particular terminal, and coupling means operatively coupled to the first and second output voltage means for coupling such output voltage means to delay any changes in an individual one of the first and second output voltages in accordance with changes in the other one of the first and second output voltages.

2. In a combination as set forth in claim 1, means for providing an energizing voltage, the first output voltage means including a first semiconductor device having first, second and third terminals, the first terminal in the first semiconductor device being connected to receive the voltage at the first particular terminal, the second terminal in the first semiconductor device being connected to the second constant current means and the third terminal in the semiconductor device being connected to receive the energizing voltage, the second output voltage means including a second semiconductor device having first, second and third terminals, the first terminal of the second semiconductor device being connected to receive the voltage at the second particular terminal, the second terminal of the second semiconductor device being connected to the third constant current means and the third terminal of the second semiconductor device being connected to receive the energizing voltage, and the coupling means including a capacitor connected to the second terminals of the first and second semiconductor devices.

3. In combination in a delay stage, means for providing first and second complementary input voltages having a particular relationship at an instant in time during the provision of the first and second complementary input voltages, means for providing an adjustable biasing voltage, means for providing a first constant current, and means including the first constant current means and responsive to the adjustable biasing voltage and to changes in the first and second complementary input voltages for producing first and second resultant voltages with a delay in a particular relationship between the first and second resultant voltages from the particular relationship in the first and second complementary input voltages, the delay being dependent upon the adjustments in the magnitude of the adjustable biasing voltage, means responsive to the first and second resultant voltages and including second and third constant current means for producing first and second output voltages providing an additional delay in the particular relationship between the first and second output voltages from the time of the particular relationship in the first and second complementary input voltages, the last mentioned means including a pair of means respectively coupled to individual ones of the second and third constant current means, each of the means in the pair being responsive to an individual one of the first and second resultant voltages for producing changes in a flow of current through the other one of the means in the pair in accordance with changes in such individual one of the first and second resultant voltages, the last mentioned means further including coupling means for coupling the means in the pair to maintain the current through the other one of the means in the pair in accordance with changes in the flow of current through the individual one of the means in the pair.

4. In combination in a delay stage, means for providing first and second complementary input voltages having a particular relationship at an instant during the provision of the first and second complementary input voltages, means for providing an adjustable biasing voltage, means responsive to changes in the first and second complementary input voltages for providing first and second resultant voltages having changes in magnitude with changes in time, adjustable delay means responsive to the adjustable biasing voltage and to the changes in magnitude of the first and second resultant voltages for providing an adjustable delay in the particular relationship in the first and second resultant voltages relative to the particular relationship in the first and second complementary input voltages, the adjustable delay being dependent upon the adjustments in the magnitude of the adjustable biasing voltage, the adjustable delay means including first and second semiconductor devices each constructed to have conductive and non-conductive states, each of individual ones of the first and second semiconductor devices in the adjustable delay means being responsive to the adjustable biasing voltage and an individual one of the first and second resultant voltages for becoming conductive in accordance with the occurrence of at least a particular voltage difference between the adjustable biasing voltage and such individual one of the first and second resultant voltages, and means responsive to the first and second resultant voltages and including first and second constant current means and including means for coupling the first and second constant current means for providing for the flow of current through the first and second constant current means and the coupling means in accordance with the changes in the first and second resultant voltages to provide first and second complementary output voltages with an additional delay in the particular relationship of the first and second complementary output voltages from the particular relationship of the complementary input voltages.

5. In combination, means for providing first and second complementary input voltages having a particular relationship at an instant of time in the provision of the first and second complementary input voltages, first and second constant current means, first and second switching means each responsive to an individual one of the first and second complementary input voltages and each coupled to an individual one of the first and second constant current means to define first and second current paths each including the individual one of the first and second constant current means and the individual one of the first and second switching means, coupling means for coupling the switching means in each of the first and second current paths to the constant current means in the other path to provide for the flow of current from individual ones of the switching means through the first and second constant current means in accordance with changes in the first and second complementary input voltages, and means respectively connected to the first and second switching means for respectively providing first and second complementary output voltages having the particular relationship delayed in time relative to the particular relationship in the first and second input voltages.

6. In a combination as set forth in claim 5, means for providing a reference potential, the first and second switching means respectively including first and second semiconductor devices each having first, second and third terminals, the first terminal in each semiconductor device being connected to receive an individual one of the first and second complementary input voltages, the second terminal in each semiconductor device being connected to an individual one of the first and second constant current means, the third terminal of each semiconductor device being connected to the means for providing the reference potential, the means for providing the first and second complementary output voltages respectively including first and second output lines each connected to the second terminal of an individual one of the first and second semiconductor devices.

7. In a combination as set forth in claim 5, the coupling means including a capacitor.

8. In combination for providing an adjustable delay in a delay stage, means for providing an adjustable biasing voltage, means for providing first and second complementary input voltages having a particular relationship at an instant of time during the provision of the first and second complementary input voltages, resultant voltage means responsive to the first and second complementary input voltages and the adjustable biasing voltage for providing first and second complementary resultant voltages having the particular relationship delayed from the particular relationship in the first and second complementary input voltages by a time dependent upon the magnitude of the adjustable biasing voltage, and delay means responsive to the first and second complementary resultant voltages for delaying the particular relationship in the resultant voltages by an additional period of time to obtain first and second complementary output voltages having the particular relationship, the delay including a pair of conductive means each responsive to an individual one of the first and second complementary resultant voltages for producing changes in a flow of current through such conductive means in the pair in accordance with the first and second complementary resultant voltages and the delay means including coupling means for providing a coupling between the first and second conductive means in accordance with the changes in the flow of current in such conductive means.

9. In a combination as set forth in claim 8, the resultant voltage means constituting first resultant voltage means, the delay means constituting first delay means, the coupling means constituting first coupling means, the pair of conductive means constituting a first pair, second resultant voltage means, second delay means and second coupling means respectively corresponding to the first resultant voltage means, the first delay means and the first coupling means, the second resultant voltage means receiving as complementary input voltages the complementary output voltages from the first delay means, a second pair of conductive means corresponding to the conductive means in the first pair, means for introducing the output voltages from the first delay means as input voltages to the second resultant voltage means, and means for producing further changes in the first and second complementary resultant voltages in accordance with the output voltages from the second delay means, each of the conductive means in the first pair including an individual one of constant current means in a first pair, and the first coupling means including a first capacitor connected between the constant current means in the first pair, each of the conductive means in the second pair including an individual one of constant current means in a second pair, the second coupling means including a second capacitor connected between the constant current means in the second pair.

10. In a combination as set forth in claim 8, the conductive means in the pair are disposed in first and second current paths and the coupling means defining a coupling between the first and second current paths, each of the first and second current paths including an individual one of first and second constant current means.

11. In a combination as set forth in claim 10, the resultant voltage means including third constant current means and including first and second impedances and the resultant voltage means being responsive to an individual one of the first and second complementary input voltages for producing at the individual one of the impedances a voltage with changes in magnitude in accordance with the changes in the individual one of the first and second complementary input voltages, the resultant voltage means also including conductive means in a second pair, each of the conductive means in the second pair being responsive to the adjustable biasing voltage and to the changes in the magnitude of the voltage at an individual one of the first and second impedances for passing a current in accordance with the voltage difference between the adjustable biasing voltage and the voltage at the individual one of the first and second impedances to limit any further changes in the magnitudes of the voltages at the first and second impedances.

12. In combination in a delay stage for providing an adjustable delay, means for providing an adjustable biasing voltage, means for providing first and second complementary input voltages, means for providing a first constant current, first resultant voltage means responsive to changes in the first complementary input voltage and including the first constant current means and including a first particular terminal for producing changes in a first resultant voltage at the first particular terminal in accordance with such changes in the first complementary input voltage, second resultant voltage means responsive to changes in the second complementary input voltage and including the constant current means and including a second particular terminal for producing changes in a second particular resultant voltage at the second particular terminal in accordance with such changes in the second complementary input voltage, means operatively coupled to the first particular terminal and responsive to the adjustable biasing voltage and the changes in the first resultant voltage at the first particular terminal for maintaining the first resultant voltage at the first particular terminal at a first particular level when a particular relationship exists between the adjustable biasing voltage and the first resultant voltage, means operatively coupled to the second particular terminal and responsive to the adjustable biasing voltage and the changes in the second resultant voltage at the second particular terminal for maintaining the second resultant voltage at the second particular terminal at a second particular level when the particular relationship exists between the adjustable biasing voltage and the first resultant voltage, means for providing a second constant current, means for providing a third constant current, first output voltage means responsive to the voltage at the first particular terminal and including the second constant current means for producing a first output voltage having characteristics dependent upon the characteristics of the voltage at the first particular terminal, second output voltage means responsive to the voltage at the second particular terminal and including the third constant current means for producing a second output voltage having characteristics dependent upon the characteristics of the voltage at the second particular terminal, coupling means operatively coupled to the first and second output voltage means for coupling such output voltage means to delay any changes in an individual one of the first and second output voltages in accordance with changes in the other one of the first and second output voltages, the combination of the means recited above constituting a first delay stage, means for providing a second delay stage corresponding to the first delay stage, means for introducing the output voltages from the first and second output voltage means as complementary input voltages to the means in the second delay stage corresponding to the means in the first delay stage for providing the first and second input voltages, and means respectively coupling the first and second resultant voltage means in the first delay stage to the first and second output voltage means in the second delay stage to accelerate the time in which the first and second resultant voltage means in the first delay stage are able to respond to the first and second complementary input voltages.

13. In combination in a delay stage, means for providing first and second complementary input voltages having a particular relationship at an instant in time during the provision of the first and second complementary input voltages, means for providing an adjustable biasing voltage, means for providing a first constant current, means including the first constant current means and responsive to the adjustable biasing voltage and to changes in the first and second complementary input voltages for producing first and second resultant voltages with a delay in a particular relationship between the first and second resultant voltages from the particular relationship in the first and second complementary input voltages, the delay being dependent upon the adjustments in the magnitude of the adjustable biasing voltage, and means responsive to the first and second resultant voltages and including second and third constant current means for producing first and second output voltages providing an additional delay in the particular relationship between the first and second output voltages from the time of the particular relationship in the first and second complementary input voltages, the means including the first constant current means and the means including the second and third constant current means constituting a first delay stage, means for providing a second delay stage corresponding to the first delay stage, means for introducing the first and second output voltages in the first delay stage as the complementary input voltages in the second delay stage, and means for coupling the means for providing the output voltages in the second delay stage to the first and second resultant voltage means in the first delay stage to accelerate the time in which the first and second resultant voltage means in the first delay stage is able to respond to the first and second complementary input voltages.

14. In combination in a delay stage, means for providing first and second complementary input voltages having a particular relationship at an instant in time during the provision of the first and second complementary input voltages, means for providing an adjustable biasing voltage, means for providing a first constant current, means including the first constant current means and responsive to the adjustable biasing voltage and to changes in the first and second complementary input voltages for producing first and second resultant voltages with a delay in a particular relationship between the first and second resultant voltages from the particular relationship in the first and second complementary input voltages, the delay being dependent upon the adjustments in the magnitude of the adjustable biasing voltage, means responsive to the first and second resultant voltages and including second and third constant current means for producing first and second output voltages providing an additional delay in the particular relationship between the first and second output voltages from the time of the particular relationship in the first and second complementary input voltages, the last mentioned means including a pair of means respectively coupled to individual ones of the second and third constant current means, each of the means in the pair being responsive to an individual one of the first and second resultant voltages for producing changes in a flow of current through the other one of the means in the pair in accordance with changes in such individual one of the first and second resultant voltages, the last mentioned means further including coupling means for coupling the means in the pair to maintain the current through the other one of the means in the pair in accordance with changes in the flow of current through the individual one of the means in the pair, the combination of the means recited above constituting a first delay stage, means for providing a second delay stage corresponding to the first delay stage, means for introducing the first and second output voltages in the first delay stage to the second delay stage as the complementary input voltages in the second delay stage, and means respectively responsive to the output voltages in the second delay stage for reducing the time in which the first and second resultant voltage means in the first delay stage produces the first and second resultant voltages in the first delay stage.

15. In combination in a delay stage, means for providing first and second complementary input voltages having a particular relationship at an instant of time during the provision of the complementary input voltages, means for providing an adjustable biasing voltage, means responsive to changes in the first and second complementary input voltages for providing first and second resultant voltages having changes in magnitude with changes in time, means responsive to the adjustable biasing voltage and to the changes in magnitude of the first and second resultant voltages for providing an adjustable delay in the particular relationship of the first and second resultant voltages from the time for the particular relationship in the first and second complementary input voltages, the adjustable delay being dependent upon adjustments in the magnitude of the adjustable biasing voltage.

means responsive to the first and second resultant voltages and including first and second constant current means for producing first and second complementary output voltages with additional delays in the particular relationship of the first and second output voltages from the time for the particular relationship in the first and second complementary input voltages, the means providing the adjustable delay and the means providing the additional delays constituting a first delay stage, means for providing a second delay stage corresponding to the first delay stage, means for introducing the first and second output voltages in the first delay stage as the complementary input voltages in the second delay stage, and means responsive to the first and second output voltages in the second delay stage for decreasing the time between successive productions of the first and second complementary resultant voltages in the first delay stage without affecting the time of the production of such additional delay.

16. In combination, a first transistor having a base, an emitter and a collector, a second transistor having a base, an emitter and a collector, means for introducing a first input voltage to the base of the first transistor, means for introducing a second input voltage to the base of the second transistor, means for applying an energizing voltage to the collectors of the first and second transistors, first and second constant current means respectively connected to the emitters of the first and second transistors, and means connected between the emitters of the first and second transistors for delaying the response of the second transistor to the second input voltage relative to the response of the first transistor to the first input voltage.

17. In a combination as set forth in claim 16, means connected to the emitter of the first transistor for obtaining a first output voltage, and means connected to the emitter of the second transistor for obtaining a second output voltage delayed relative to the first output voltage, the delaying means constituting a capacitance.

18. In combination, first and second constant current means, first and second switching means, means including the first constant current means and the first switching means for defining a first current path, means including the second constant current means and the second switching means for defining a second current path, means for introducing a first complementary input voltage to the first switching means to produce a current through the first current path, means for introducing a second complementary input voltage to the second switching means to produce a current through the second current path, and means for delaying the response of the second switching means to the second complementary input signal while maintaining the substantially constant current through the second constant current means.

19. In a combination as set forth in claim 18, the delaying means being connected between the first and second switching means.

20. In a combination as set forth in claim 18, the delaying means being a capacitance.

21. In a combination as set forth in claim 18, the delaying means including means connected to the first and second switching means for obtaining first and second output voltages delayed relative to the first and second complementary input voltages.

22. In combination, means for providing first and second complementary input voltages, means for providing an adjustable biasing voltage, resultant voltage means responsive to the first and second complementary input voltages and the adjustable biasing voltage for providing first and second resultant voltages, first and second constant current means, first and second switching means, means including the first constant current means and the first switching means for defining a first current path, means including the second constant current means and the second switching means for defining a second current path, means for introducing the first resultant voltage to the first switching means, means for introducing the second resultant voltage to the second switching means, and means connected between the first and second switching means for delaying the time of response of one of the switching means relative to the time of response of the other switching means in accordance with the flow of currents through the first and second current paths.

23. In a combination as set forth in claim 22, means for obtaining a first output voltage from the first switching means, and means for obtaining a second output voltage from the second switching means.

24. In a combination as set forth in claim 23, the combination of means recited in claim 23 constituting a first stage, means for defining a second stage corresponding to the first stage, third and fourth constant current means in the second stage respectively corresponding to the first and second constant current means in the first stage, third and fourth switching means in the second stage respectively corresponding to the first and second switching means in the first stage, the second stage producing third and fourth resultant voltages, means for obtaining first and second output voltages from the first and second switching means and for introducing these output voltages as input voltages to the second stage, means for obtaining third and fourth output voltages from the third and fourth switching means in the second stage, and means for introducing the output voltages from the third and fourth switching means in the second stage to the resultant voltage means in the first stage to expedite the time for the production of the first and second resultant voltages in the first stage.

25. In combination, means for providing first and second complementary input voltages, means for providing an adjustable biasing voltage, resultant voltage means responsive to the first and second complementary input voltages and the adjustable biasing voltage for providing first and second resultant voltages delayed from the first and second complementary input voltages in accordance with the adjustments in the biasing voltage, first and second transistors each having a base, an emitter and a collector, means for respectively introducing the first and second resultant voltages to the bases of the first and second transistors, means for applying an energizing voltage to the collectors of the first and second transistors, first and second constant current means respectively connected to the emitters of the first and second transistors, and means connected between the emitters of the first and second transistors for delaying the response of the second switching means to the second resultant voltage relative to the response of the first switching means to the first resultant voltage.

26. In a combination as set forth in claim 25, means connected to the emitter of the first transistor for providing a first output voltage, and means connected to the emitter of the second transistor for providing a second output voltage.

27. In a combination as set forth in claim 26, the means recited in claim 25 constituting a first combination, means for providing a second combination corresponding to the first combination, and means for introducing the first and second output voltages from the first combination as the first and second input voltages to the second combination, means for introducing the first and second output voltages from the second combination to the resultant voltage means in the first combination.

28. In a combination as set forth in claim 2, first and second metal lines spaced from each other and disposed above the first semiconductor device, third and fourth metal lines spaced from each other and disposed above the second semiconductor device, the first and third metal lines corresponding to each other and the second and fourth lines corresponding to each other, the first and fourth lines being connected to each other and to the second terminal of the first semiconductor device, the second and third lines being connected to each other and to the second terminal of the second semiconductor device, there being distributed capacitances between the first and second metal lines and between the third and fourth metal lines, the distributed capacitances constituting the capacitor included in the coupling means.

29. In a combination as recited in claim 7, a first pair of metal lines disposed above the first switching means, a second pair of metal lines disposed above the second switching means, one of the metal lines in the first pair and one of the metal lines in the second pair being connected to the first switching means, the other of the metal lines in the first pair and the other of the metal lines in the second pair being connected to the second switching means, there being distributed capacitances between the metal lines in the first pair and between the metal lines in the second pair, the distributed capacitances defining the capacitor.

30. In a combination as set forth in claim 17, a first pair of metal lines disposed above the first transistor and providing distributed capacitances between the metal lines in the first pair, a second pair of metal lines disposed above the second transistor and providing distributed capacitances between the metal lines in the second pair, means for connecting one of the metal lines in the first pair and one of the metal lines in the second pair to the emitter of the first transistor, means for connecting the other one of the metal lines in the first pair and the other one of the metal lines in the second pair to the emitter of the second transmitter, the distributed capacitances providing the capacitance constituting the delaying means.

31. In a combination as set forth in claim 26, first and second metal lines above the first transistor, third and fourth metal lines above the second transistor, the third metal line corresponding to the first metal line and the fourth metal line corresponding to the second metal line, means for connecting the second and third metal lines to the emitter of the first transistor, means for connecting the first and fourth metal lines to the emitter of the second transistor, there being distributed capacitances between the first and second metal lines and between the third and fourth metal lines, the distributed capacitances being included in the delaying means.

* * * * *